United States Patent
Kang (10) Patent No.: US 12,426,389 B2
(45) Date of Patent: Sep. 23, 2025

(54) INFRARED DETECTOR HAVING VERTICAL SIDEWALL SENSITIVE LAYER AND MANUFACTURING METHOD THEREOF

(71) Applicant: SHANGHAI IC R&D CENTER CO., LTD., Shanghai (CN)

(72) Inventor: Xiaoxu Kang, Shanghai (CN)

(73) Assignee: SHANGHAI IC R&D CENTER CO., LTD., Shanghai (CN)

( * ) Notice: Subject to any disclaimer, the term of this patent is extended or adjusted under 35 U.S.C. 154(b) by 973 days.

(21) Appl. No.: 16/624,907

(22) PCT Filed: Jun. 30, 2017

(86) PCT No.: PCT/CN2017/091082
§ 371 (c)(1),
(2) Date: Jan. 19, 2022

(87) PCT Pub. No.: WO2019/000384
PCT Pub. Date: Jan. 3, 2019

(65) Prior Publication Data
US 2022/0149106 A1    May 12, 2022

(30) Foreign Application Priority Data
Jun. 29, 2017  (CN) .......................... 201710516399.2
Jun. 29, 2017  (CN) .......................... 201710516500.4

(51) Int. Cl.
| H10F 39/18 | (2025.01) |
| G01J 5/02 | (2022.01) |
| G01J 5/10 | (2006.01) |
| G01J 5/20 | (2006.01) |
| H10F 39/00 | (2025.01) |

(52) U.S. Cl.
CPC ............ *H10F 39/184* (2025.01); *G01J 5/024* (2013.01); *G01J 5/10* (2013.01); *G01J 5/20* (2013.01); *H10F 39/014* (2025.01); *H10F 39/80* (2025.01)

(58) Field of Classification Search
CPC ......... H01L 27/14649; H01L 27/14601; H01L 27/14689; H01L 31/101; G01J 5/024; G01J 5/10; G01J 5/20; G01J 2005/202
See application file for complete search history.

(56) References Cited

U.S. PATENT DOCUMENTS

| 2017/0074766 A1* | 3/2017 | Lambert | ................. G01N 5/045 |
| 2018/0212080 A1* | 7/2018 | Meyer | ................... G02B 6/124 |

FOREIGN PATENT DOCUMENTS

CN            104409530 A   *   3/2015

* cited by examiner

*Primary Examiner* — David P Porta
*Assistant Examiner* — Carolyn Fin
(74) *Attorney, Agent, or Firm* — Bayramoglu Law Offices LLC (57) ABSTRACT

The present disclosure provided an infrared detector having a vertical sidewall sensitive layer and a manufacturing method thereof. By forming at least one fin structure on a semiconductor substrate; and a sensitive layer can be formed on the sidewall of the fin structure by ion implantation. The vertical sidewall sensitive layer is configured to reduce the impact of lithography on the sensitive layer, thereby reducing the impact on the sensitivity of the sensitive layer (03).

19 Claims, 8 Drawing Sheets

INFRARED DETECTOR HAVING VERTICAL SIDEWALL SENSITIVE LAYER AND MANUFACTURING METHOD THEREOF

CROSS-REFERENCE TO RELATED APPLICATION

This application claims priority of International Patent Application Serial No. PCT/CN2017/091082, filed Jun. 30, 2017, which is related to and claims priority of Chinese patent application serial No. 201710516399.2, 201710516500.4 filed Jun. 29, 2017. The entirety of each of the above-mentioned patent applications is hereby incorporated herein by reference and made a part of this specification.

TECHNICAL FIELD

The invention relates to the technical field of image sensors, in particular to an infrared detector with a vertical sidewall sensitive layer and a manufacturing method of the infrared detector.

BACKGROUND

Conventional uncooled infrared detector sensitive layer is a planar structure, and the sensitive layer is sandwiched between an upper electrode and a lower electrode. During the design of conventional resistors, the resistance value is affected by factors such as lithography and critical dimension after etching, film thickness and the like, so that the uniformity is worsening. After the uniformity of pixel sensitive resistance in the array is worsen, a compensation resistance needs to be added in an ASIC circuit design in order to compensate. However, the compensation capability of this technology is limited, moreover, it will increase the complexity and the cost of the circuit, which will reduce the overall performance of the product and increase the cost. In addition, the resistivity of a part of sensitive material is high, in order to reduce the bias voltage, the design value for the sensitive resistor has to be reduced, however, it is very difficult for the conventional planar structure.

Therefore, it is urgent to research how to reduce the influence of lithography and film thickness on the sensitive layer, so that the sensitive layer precision and the sensitivity of the whole device can be improved.

SUMMARY

In order to overcome the above problems, present disclosure aims to provide an infrared detector and a manufacturing method thereof, and the influence of lithography on a sensitive layer is reduced by arranging a vertical sidewall sensitive layer.

In order to achieve the purpose, the present disclosure provides an infrared detector which comprises at least one fin structure and a sensitive layer located on the sidewall of the fin structure.

Preferably, the fin structure comprises a plurality of parallel fins in a first direction and a fin in a second direction; the terminals of the fins in the first direction are connected to the fin in the second direction; the first direction and the second direction are perpendicular to each other.

Preferably, the fin structure is M-shaped, U-shaped or comb-teeth shaped.

Preferably, a lower electrode layer is located at the bottom of the fin structure, and the lower electrode layer is in contact with the bottom of the sensitive layer; and an upper electrode layer is located above the fin structure, and the upper electrode layer is in contact with the top of the sensitive layer.

Preferably, a part of one sidewall of the fin structure in the second direction is not provided with the sensitive layer, and an output terminal of the upper electrode layer is connected with an edge of the upper electrode layer and is adjacent to the sidewall of the fin structure which is not provided with the sensitive layer in the second direction extending to the surface of a semiconductor substrate; and the bottom of the output terminal of the upper electrode layer is not in contact with the lower electrode layer.

Preferably, the sensitive layer is further located on the top of the fin structure.

Preferably, the sensitive layer is only located on the sidewall of the fin structure, and the sensitive layer is surroundingly attached to the fin structure, wherein the sensitive layer is provided with an opening so that the terminals of the sensitive layer on the two sides of the opening are formed.

Preferably, the sensitive layer is attached to the inner sidewall and the outer sidewall of the fin structure and is not arranged on the sidewall of the fin in the second direction.

Preferably, the detector further comprises a first electrode layer and a second electrode layer, the first electrode layer and the second electrode layer are respectively in one-to-one connection with the two terminals; the first electrode layer and the second electrode layer are not in contact with each other.

Preferably, the first electrode layer is attached to the terminal surface of one sidewall of the fin structure, and the second electrode layer is attached to the terminal surface of the other sidewall of the fin structure.

Preferably, the width of the opening is smaller than or equal to the distance between the first electrode layer and the second electrode layer.

Preferably, a barrier layer formed by ion implantation is further arranged on the top of the fin structure located between the sensitive layers.

Preferably, the sidewalls of the plurality of fins of the fin structure surrounded by sensitive layers are physically connected to each other and form a continuous film layer.

In order to achieve the purpose, the present disclosure further provides a manufacturing method of the infrared detector, which comprises the following steps:

Step 01, providing a semiconductor substrate;

Step 02, preparing a lower electrode layer on the surface of the semiconductor substrate;

Step 03, preparing at least one fin structure on the lower electrode layer;

Step 04, forming a sensitive layer on a sidewall of the fin structure;

Step 05, forming an upper electrode layer above the fin structure, wherein the upper electrode layer is in contact with the top of the sensitive layer.

Preferably, in the step 03, the fin structure is prepared by an etching process, and the fin structure comprises a plurality of parallel fins in the first direction and a fin in the second direction, the terminals of the fins in the first direction are connected to the fin in the second direction; the first direction and the second direction are perpendicular to each other.

Preferably, the step 04 comprises: firstly, depositing a sensitive layer on the sidewall and the top of the fin; then, etching to remove a part of the sensitive layer of the outer sidewall of the fin in the second direction, and exposing the outer sidewall of the fin in the second direction.

Preferably, the step 05 comprises: firstly, depositing an upper electrode layer on the semiconductor substrate of the step 04; then, etching to remove the upper electrode layer on the sidewall of the sensitive layer and a part of the upper electrode layer on the surface of the semiconductor substrate; and reserving the upper electrode layer on the top of the sensitive layer and the top of the fin structure, and the upper electrode layer of the outer sidewall is exposed by the fin in the second direction, thereby forming an upper electrode layer pattern and forming a output terminal pattern of the upper electrode layer.

Preferably, in the step 04, during etching, the sensitive layer located on the top of the fin structure is also removed.

In order to achieve the purpose, the present disclosure further provides a manufacturing method of the infrared detector, which comprises the following steps:

Step 01, forming at least one fin structure;

Step 02, forming a sensitive layer on all sidewalls of the fin structure;

Step 03, etching the sensitive layers on a part of the sidewalls of the fin structure, and etching an opening in the sensitive layer so that the sensitive layer is provided with two terminals, the two terminals are not in contact, and the sidewalls of a part of the fin structures are exposed through the opening;

Step 04, forming a first electrode layer and a second electrode layer on the two terminals respectively, wherein the first electrode layer and the second electrode layer are not in contact.

Preferably, between the step 01 and the step 02, the method further comprises: performing an ion implantation on the top of the fin structure to form a barrier layer.

Preferably, the step 04 comprises: firstly, forming an electrode material layer on the top of the fin structure, the exposed sidewall of the fin structure, and the top and the sidewall of the sensitive layer; then, etching the electrode material layer to form a first electrode layer and a second electrode layer, the first electrode layer and the second electrode layer are not in contact.

Preferably, in step 03, the width of the formed opening is smaller than or equal to the distance between the first electrode layer and the second electrode layer.

According to the infrared detector of the present disclosure, the design of a vertical sidewall sensitive layer is adopted, and according to the formula:

$$R=\rho*L/(W*t)$$

Wherein: W is the width, L is the length, t is the thickness, and the thickness of the doped film is ignored, the thickness of the non-doped film serves as L, the length of the fin structure serves as W, and therefore the obtained error R is small.

DETAILED DESCRIPTION

In order to make the content of the present disclosure clearer and easier to understand, the contents of the present disclosure will be further described below in conjunction with the drawings. Of course, the invention is not limited to the specific embodiments, and general substitutions well known to those skilled in the art are also encompassed within the protection scope of the present disclosure.

The infrared detector comprises at least one fin structure and a sensitive layer located on the sidewall of the fin structure.

The fin structure of one embodiment of the present disclosure may comprise a plurality of parallel fins in a first direction and a fin in a second direction, and the terminals of the fins in the first direction are connected to the fin in the second direction to form a serpent structure, and the first direction and the second direction are perpendicular to each other.

The fin structure of one embodiment of the invention can be M-shaped, U-shaped or comb-teeth shape, etc.

First Embodiment

The present disclosure will be further described in detail below with reference to FIGS. 1-14 and specific embodiments. It should be noted that the drawings all adopt a very simplified form and use the non-precise proportion and are only used for conveniently and clearly achieving the purpose of assisting in describing the embodiment.

Figure 1:
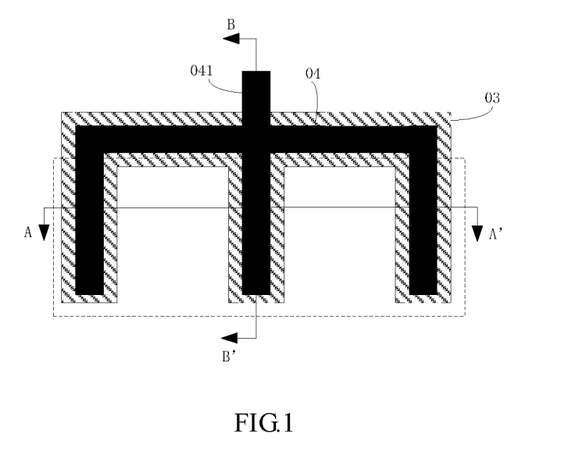
FIG. 1 is a top view of an infrared detector according to a preferred embodiment of the present disclosure
Figure 2:
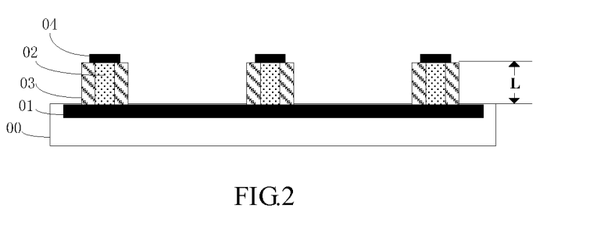
FIG. 2 is a cross-sectional structural schematic diagram of the infrared detector in the AA' direction of FIG. 1
Figure 3:
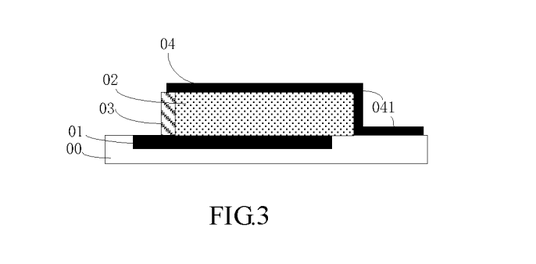
FIG. 3 is a cross-sectional structural schematic diagram of the infrared detector in the BB' direction of FIG. 1

Referring to FIGS. 1-3, an infrared detector according to an embodiment comprises a semiconductor substrate 00, a fin structure 02, a sensitive layer 03, an upper electrode layer 04 and a lower electrode layer 01.

Specifically, referring to FIG. 1, the dotted lines in FIG. 1 represent the lower electrode layer and are only used for representative purpose. In this embodiment, the fin structure 02 having four fins are formed on the semiconductor substrate 00; the sensitive layer 03 is located on the sidewalls of the fin structures 02. Here, the sidewalls of the fin structure 02 formed by the sensitive layer 03 surrounding the four fins are connected to each other and form a continuous film layer. Specifically, in the present embodiment, the fin structure 02 having four fins, three fins 02 are arranged in parallel, each terminal of the three fins 02 are vertically crossed the remaining fin 02, as shown in FIG. 1, the fin structure is in an M-shape.

Referring to FIG. 2, the lower electrode layer 01 is located at the bottom of the fin structure 02, and the lower electrode layer 01 is in contact with the bottom of the sensitive layer 03. Meanwhile, the upper electrode layer 04 is located above the fin structure 02, and the upper electrode layer 04 is in contact with the top of the sensitive layer 03. Here, the lower electrode layer 01 is embedded in the surface layer of the semiconductor substrate 00; or the lower electrode layer 01 can also be located on the surface of the semiconductor substrate 00, and a dielectric layer is deposited on the surface of the semiconductor substrate 00 exposed outside the lower electrode layer 01.

In this embodiment, in order to avoid the short circuit between the upper electrode layer 04 and the lower electrode layer 01: the bottom of the output terminal 041 of the upper electrode layer 04 is not in contact with the lower electrode layer 01: as shown in FIG. 3, in the present embodiment, a lower electrode layer 01 is not arranged at the bottom of the fin structure 02 with the output terminal 041 of the upper electrode layer 04. Further, the sensitive layer 03 can also transmit a signal. In order to better prevent a short circuit between the upper electrode layer 04 and the lower electrode layer 01, a part of the outer sidewall of the remaining fin is not provided with the sensitive layer 03, specifically, a part of the outer sidewall of the horizontal fin is not provided with a sensitive layer 03; and the output terminal 041 of the upper electrode layer 04 is connected with an edge of the upper electrode layer 04, and is adjacent to the sidewall of the remaining fin (horizontal fin) which is not provided with the sensitive layer 03 extending to the surface of the semiconductor substrate 00. In addition, in the embodiment, the output terminal 041 of the upper electrode layer 04 also extends to the surface of the semiconductor substrate 00 and continues to extend along the surface of the semiconductor substrate 00 horizontally.

In this way, the infrared detector of the present embodiment, according to the formula $R=\rho*L/(W*t)$, wherein W is the width, L is the length, t is the thickness, and the doped film is the sensitive layer 03, the thickness of the sensitive layer 03 is negligible, and the thickness of the non-doped film is the height of the fin structure 02 as L, and the circumference of one fin structure formed by the plurality of fins is approximately equal to W so that the obtained error R is small.

Figure 4:
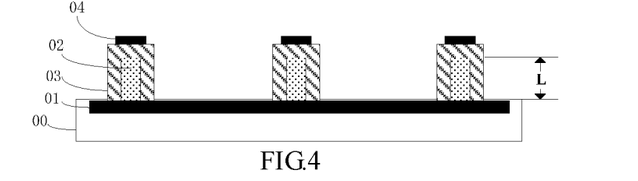
FIG. 4 is a cross-sectional structural schematic diagram of another infrared detector in the AA' direction of FIG. 1
Figure 5:
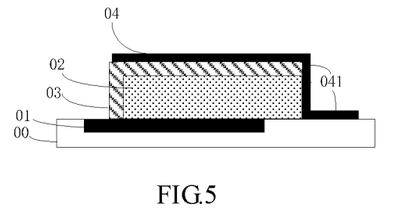
FIG. 5 is a cross-sectional structural schematic diagram of another infrared detector in the BB' direction of FIG. 1

In addition, referring to FIGS. 4-5, the infrared detector of another embodiment of the present disclosure differs from the infrared detector of the above embodiment, the sensitive layer 03 is further located on the top of the fin structure 02: so that the line width of the upper electrode layer 04 on the top of the fin structure 02 can be reduced, and the resistivity p is further reduced. In addition, according to the formula $R=\rho*L/(W*t)$, the thickness of the sensitive layer 03 is negligible, and the height of the fin structure 02 is still L, therefore, the sensitive layer 03 on the top of the fin structure 02 does not influence the overall effect of the error R.

Figure 6:
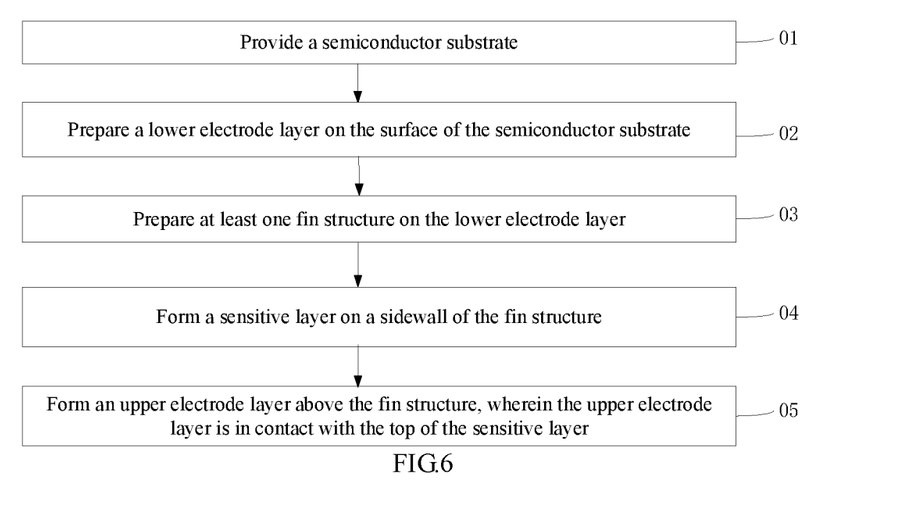
FIG. 6 is a schematic flow chart of a manufacturing method of an infrared detector according to a preferred embodiment of the present disclosure
Figure 7:
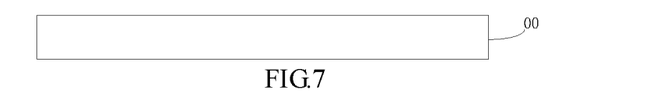
FIGS. 7-14 are schematic diagrams of various manufacturing steps of the manufacturing method of the infrared detector of FIG. 6
Figure 8:
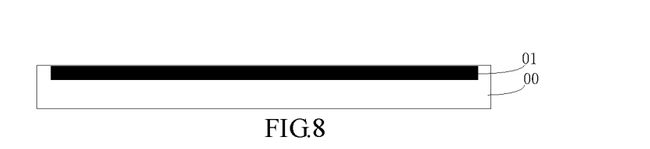
Figure 9:
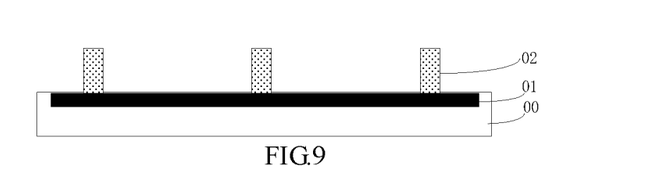
Figure 10:
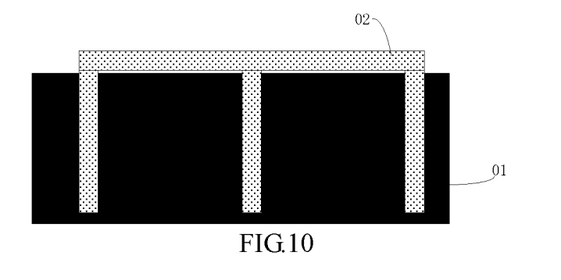
Figure 11:
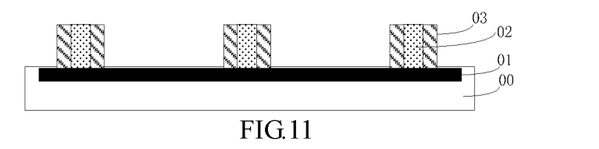
Figure 12:
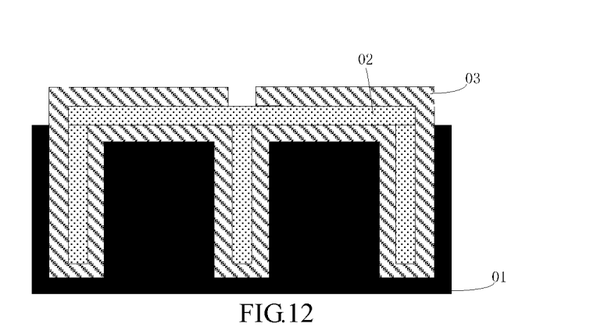

Referring to FIG. 6, the manufacturing method of the infrared detector according to the embodiments is described as an example. The method specifically comprises the following steps:

Step 01: referring to FIG. 7, providing a semiconductor substrate 00;

Specifically, the semiconductor substrate 00 may be, but is not limited to, a silicon substrate Step 02: referring to FIG. 8, preparing a lower electrode layer 01 on the surface of a semiconductor substrate 00;

Specifically, the manufacturing method of the lower electrode layer 01 can include: firstly, depositing a lower electrode layer 01 on the surface of a semiconductor substrate 00, and then the lower electrode layer 01 maybe, but not limited to, etched by a lithography and etching process, to form a required pattern of the lower electrode layer 01, and a dielectric layer is deposited on the surface of the exposed semiconductor substrate 00. Alternatively, the manufacturing method of the lower electrode layer 01 may include: etching a trench for filling the lower electrode layer 01 on the surface of the semiconductor substrate 00, then depositing a lower electrode layer 01 in the trench, and performing a chemical mechanical polishing process to planarize the surface of the lower electrode layer 01, so that the lower electrode layer 01 is flush with the surface of the semiconductor substrate;

Step 03, referring to FIGS. 9 and 10, preparing at least one fin structure 02 on the lower electrode layer 01;

Specifically, FIG. 10 is a top view schematic structural diagram of FIG. 9; here, the fin structure 02 can be, but not limited to, prepared of lithography and etching processes, according to the fin structure 02 formed by the four fins of the previous embodiments, a double patterning process can be adopted, and the pattern of the fin structure can be but is not limited to, divided into a vertical sub-pattern and a horizontal sub-pattern, and then performing lithography and etching processes to each sub-pattern to obtain a final pattern of the fin structure. It is noted that the lower electrode layer 01 is not flush with the edge of the horizontal fin in order to avoid the short circuit between the upper electrode layer and the lower electrode layer, Step 04: referring to FIGS. 11 and 12, forming a sensitive layer 03 on the sidewall of the fin structure 02;

Specifically, FIG. 12 is a top view schematic structural diagram of FIG. 11; firstly, depositing a sensitive layer 03 on the sidewall and the top of the fin structure 02 and surface of the semiconductor substrate 00, performing an ion implantation enable the sensitive layer 03 to form a P-type; then, etching to remove a part of the sensitive layer 03 of the outer sidewall of the remaining fin, and exposing the outer sidewall of the remaining fin, during etching, the method further comprises the step of removing the sensitive layer 03 on the top of the fin structure 02.

Figure 13:
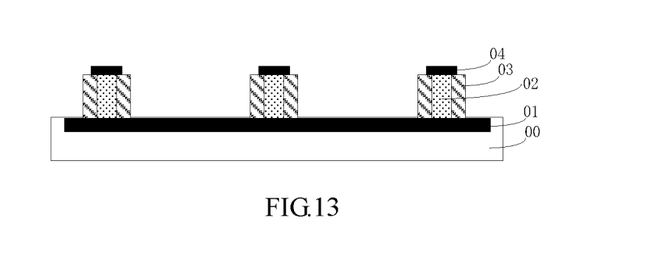
Figure 14:
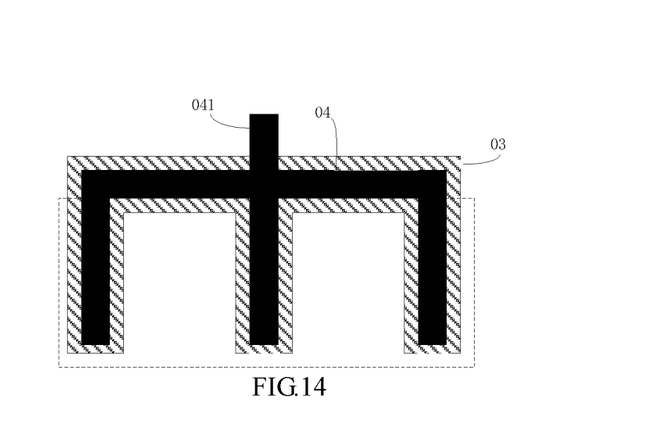

Step 05: referring to FIGS. 13 and 14, forming an upper electrode layer 04 above the fin structure 02, wherein the upper electrode layer 04 is in contact with the top of the sensitive layer 03.

Specifically, FIG. 14 is a top view schematic structural diagram of FIG. 13. firstly, depositing an upper electrode layer 04 on the semiconductor substrate 00 of the step 04; then, etching to remove the upper electrode layer 04 on the sidewall of the sensitive layer 03 and a part of the upper electrode layer 04 on the surface of the semiconductor substrate 00; and reserving the upper electrode layer 04 on the top of the sensitive layer 03 and the top of the fin structure 02, and reserving the upper electrode layer 04 of the outer sidewall is exposed by the remaining fin (horizontal fin), thereby forming a pattern of upper electrode layer 04 and forming a pattern of output terminal 041 of the upper electrode layer 04.

Second Embodiment

The present disclosure will be further described in detail below with reference to FIGS. 15-29 and specific embodiments. It should be noted that the drawings all adopt a very simplified form and use the non-precise proportion and are only used for conveniently and clearly achieving the purpose of assisting in describing the embodiment.

An infrared detector of the present embodiment comprises a fin structure 201, a sensitive layer 203, a first electrode and a second electrode 204.

Figure 15:
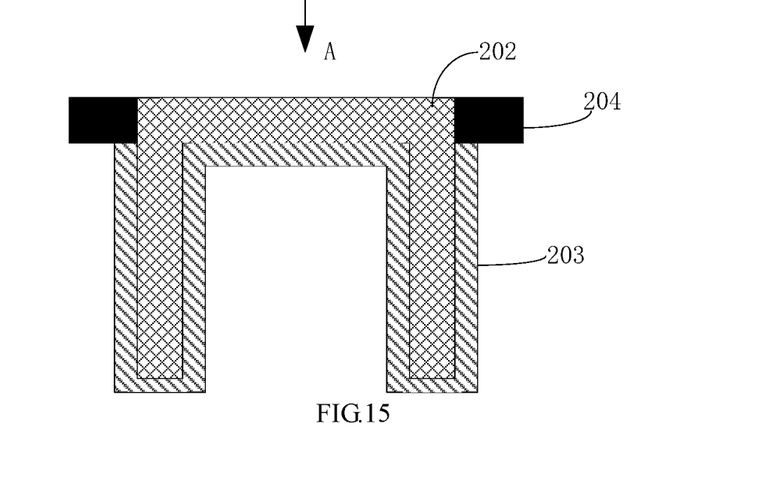
FIG. 15 is a top view of an infrared detector according to a preferred embodiment of the present disclosure
Figure 16:
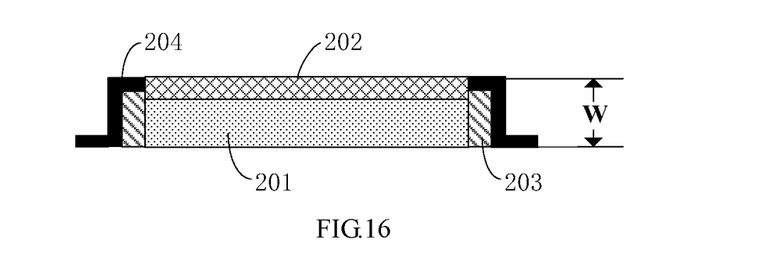
FIG. 16 is a schematic structural diagram of the infrared detector of FIG. 15 in the A direction

Specifically, referring to FIGS. 15-16, the fin structure 201 of the present embodiment may have a U-shaped fin structure, including two fins in a first direction and a fin in a second direction, and the terminals of the two fins in the first direction are connected to the fin in the second direction. The first direction is perpendicular to the second direction, here, the first direction is the vertical direction, and the second direction is the horizontal direction. The sensitive layer 203 is disposed on the sidewall of the fin structure 201 and has an opening so that the sensitive layer 203 forms the two terminals attaching the sidewalls, and the two terminals are not in contact. Specifically, the sensitive layer 203 is attached to the inner sidewall and the outer sidewall of the U-shaped fin structure and is not arranged on the sidewall of the fin in the second direction (horizontal direction) of the U-shaped fin structure. Here, the width of the opening can be smaller than or equal to the distance between the first electrode layer and the second electrode layer 204. Of course, in other embodiments, the width of the opening is greater than the distance between the first electrode layer and the second electrode layer 204, here, the opening is not arranged on the sidewall of the fin in the horizontal direction of the U-shaped fin structure, and the opening is formed in the two sidewalls of the fins in the vertical direction of the U-shaped fin structure.

In addition, in the present embodiment, the top of the fin structure 201 between the sensitive layers 203 can also be provided with a barrier layer 202 formed by ion implantation, so that electrical connection between the sensitive layers 203 of the two sidewalls of the fin structure 201 is avoided as it may cause short circuits.

The first electrode layer and the second electrode layer 204 are respectively in one-to-one connection with the two terminals of the sensitive layer 203, and the first electrode layer and the second electrode layer 204 are not in contact with each other. In this embodiment, in order to lead out the first electrode layer and the second electrode layer 204, the first electrode layer is attached to the terminal surface of one sidewall of the opening of the fin structure 201, and the second electrode layer is attached to the terminal surface of the other sidewall of the opening of the fin structure 201.

According to the formula $R=\rho*L/(W*t)$, W is the width, L is the length, t is the thickness, and here, the doped film is the sensitive layer, the non-doped film is the fin, the thickness of the sensitive layer is negligible, the height of the fin is W and the circumference of the fin structure is L so that a higher resistance R is obtained, and therefore, under the premise of ensuring the uniformity of the resistance and reducing influence to the sensitive layer by lithography and the thickness of the film, the resistance of the sensitive layer 203 can be flexibly adjusted by utilizing the vertical sidewall.

Figure 17:
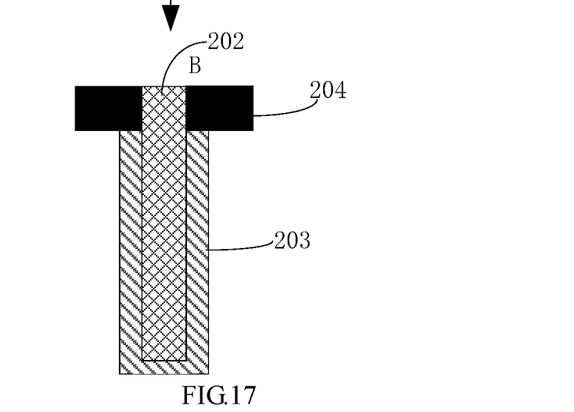
FIG. 17 is a top view of an infrared detector according to another embodiment of the present disclosure
Figure 18:
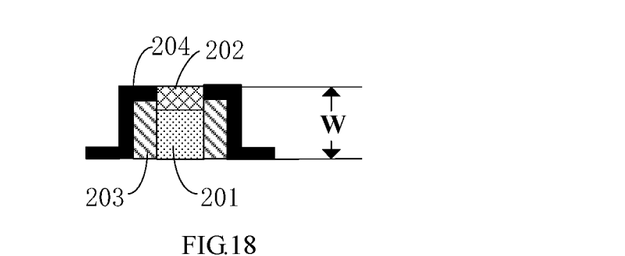
FIG. 18 is a schematic structural diagram of the infrared detector of FIG. 17 in the B direction

In addition, in other embodiments of the present disclosure, referring to FIGS. 17-18, the fin structure 201 is a rectangular fin structure, the sensitive layer 203 is arranged on the sidewall of the fin structure 201 and is provided with an opening, so that the sensitive layer 203 forms two terminals attaching the sidewalls, and the two terminals are not in contact with each other; the first electrode layer and the second electrode layer 204 are in one-to-one connection with the two terminals, and the first electrode layer and the second electrode layer are not in contact with each other. Other structures of the detector formed by the rectangular fin structure and the detector formed by the U-shaped fin structure are the same and are not further described herein.

Figure 19:
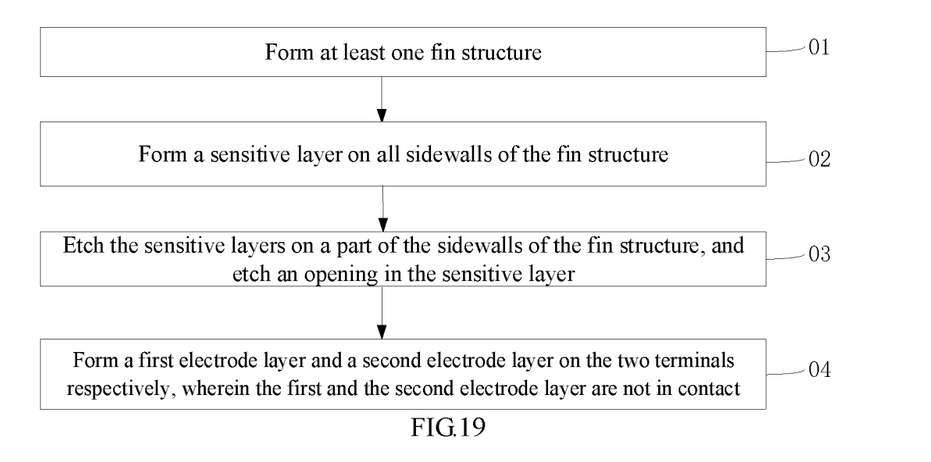
FIG. 19 is a schematic flow chart of a manufacturing method of an infrared detector according to a preferred embodiment of the present disclosure
Figure 20:
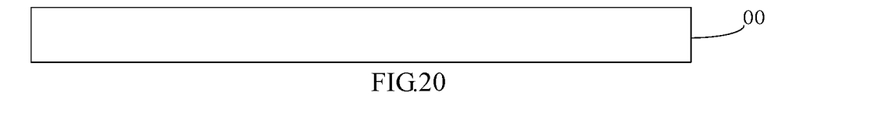
FIGS. 20-29 are schematic diagrams of each manufacturing step of the manufacturing method of the infrared detector of FIG. 19
Figure 21:
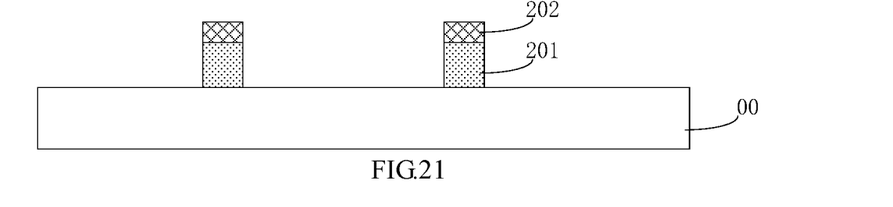
Figure 22:
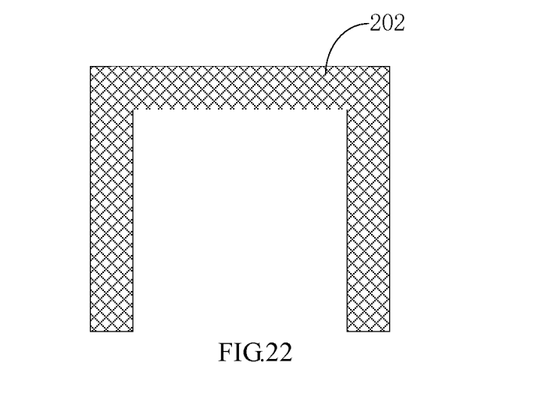
Figure 23:
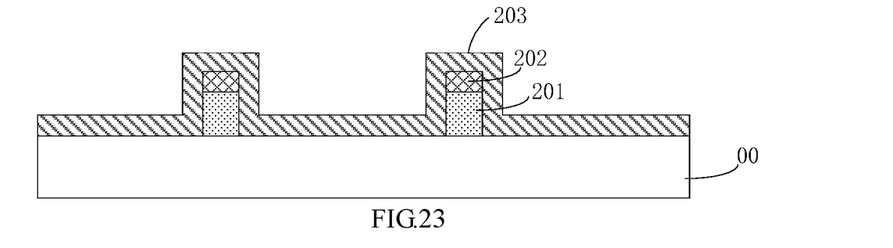
Figure 24:
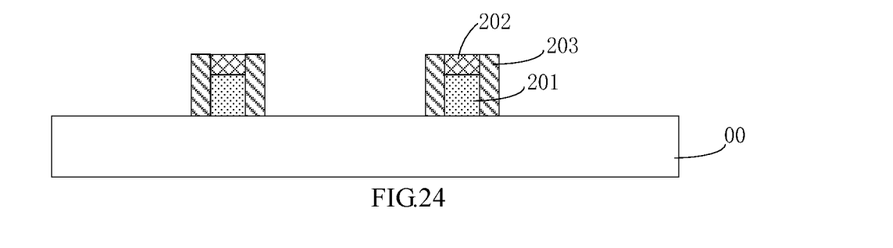
Figure 25:
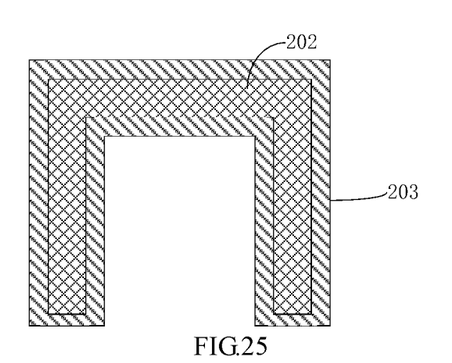
Figure 26:
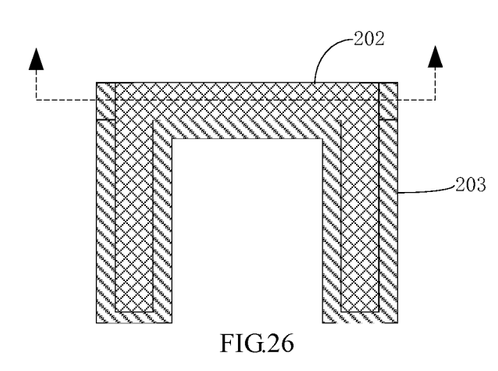

In addition, referring to FIG. 19, the manufacturing method of the infrared detector for the U-shaped fin structure in this embodiment can include the following steps:

Step 01: referring to FIGS. 20-22, forming at least one fin structure 201;

Specifically, referring to FIG. 20, a substrate 00 is provided, and in order to avoid electrical connection and short circuits between the sensitive layers 203 of the two sidewalls of the fin in the subsequently formed U-shaped fin structure, the method further comprises: depositing a material layer of the fin structure on the substrate 200, then, performing an ion implantation on the surface of the material layer of the fin structure to form a barrier layer 202: and finally, patterning the barrier layer 202 and the material layer of the fin structure, so as to form a structure as shown in FIG. 21 and FIG. 22; FIG. 22 is a top view schematic structural diagram of FIG. 21;

Step 02: referring to FIGS. 23-25, forming a sensitive layer 203 on all sidewalls of the fin structure 201;

Specifically, the sensitive layer 203 can be first deposited on the substrate 00 of the step 01: as shown in FIG. 23; then, the sensitive layer 203 of the fin structure 201 is removed by adopting a plasma anisotropic etching process, the sensitive layer 203 of the sidewalls of the fin structure 201 is retained, as shown in FIGS. 24 and 25, and FIG. 25 is a schematic top view of FIG. 24;

Step 03, referring to FIG. 26, etching the sensitive layer 203 on a part of sidewalls of the fin structure 201, and etching an opening in the sensitive layer 203 so that the sensitive layer 203 is provided with two terminals, the two terminals are not in contact, and the sidewalls of a part of the fin structure 201 are exposed through the opening;

Specifically, the sensitive layer 203 of the outer sidewall of the horizontal fin of the fin structure 201 may be removed, but not limited to, by a photolithography and etching process, the width of the formed opening is smaller than or equal to the distance between the first electrode layer and the second electrode layer, and the outer sidewall of the horizontal fin is exposed through the opening.

Figure 27:
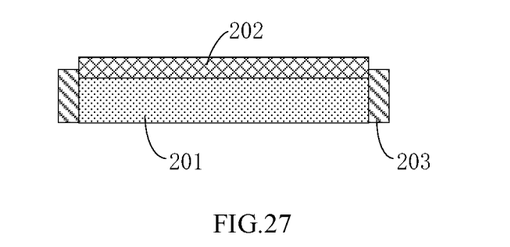
Figure 28:
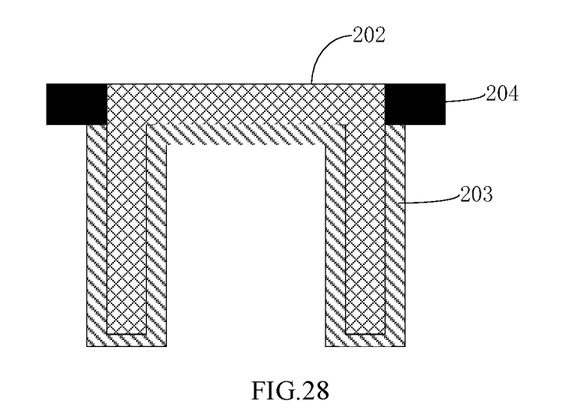
Figure 29:
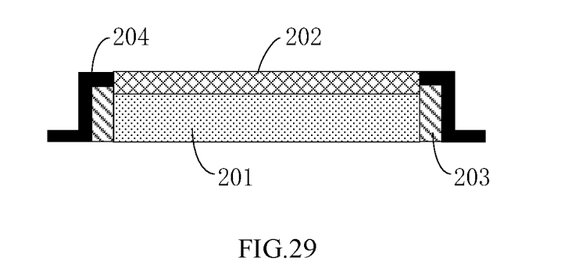

Step 04: referring to FIGS. 27-29, forming a first electrode layer and a second electrode layer 204 on the two terminals respectively, wherein the first electrode layer and the second electrode layer 204 are not in contact.

Specifically, before depositing the first electrode layer and the second electrode layer 204, the top of the two terminals of the sensitive layer 203 can be slightly etched to a certain thickness, so that the top of the first electrode layer and the top of the second electrode layer 204 are flush with the top of the fin structure 201, as shown in FIG. 27, FIG. 27 is a schematic structural diagram of the cross-section of FIG. 26 in the direction of the arrow; the manufacturing of the first electrode layer and the second electrode layer 204 further comprises: firstly, forming an electrode material layer on the top of the fin structure 201, the exposed sidewall of the fin structure 201, and the top and the sidewall of the sensitive layer 203; then, etching the electrode material layer to form a first electrode layer and a second electrode layer 204, the first electrode layer and the second electrode layer 204 are not in contact; as shown in FIGS. 28 and 29, FIG. 29 is a top view structure schematic diagram of FIG. 28;

While the present disclosure has been particularly shown and described with references as preferred embodiments thereof, it will be understood by those skilled in the art that various changes in form and details may be made therein without departing from the spirit and scope of the present disclosure as defined by the claims.

What is claimed is:

1. An infrared detector, comprising:
   at least one fin structure, as a non-doped structure, configured to have an upper wall, a bottom wall and a side wall thereof, wherein the side wall is configured to extend from the upper wall towards the bottom wall of the at least one fin structure;
   an upper electrode layer disposed on the upper wall of the at least one fin structure;
   a lower electrode layer spaced from the upper electrode layer and disposed on the bottom wall of the at least one fin structure; and
   a sensitive layer, as a doped layer, located on the sidewall of the at least one fin structure and configured to electrically connect the upper electrode layer and the lower electrode layer.

2. The infrared detector of claim 1, wherein the at least one fin structure comprises a plurality of parallel fins in a first direction and a fin in a second direction; a plurality of terminals of the fins in the first direction are connected to the fin in the second direction; the first direction and the second direction are perpendicular to each other.

3. The infrared detector of claim 2, wherein the at least one fin structure is M-shaped, U-shaped or comb-teeth shaped.

4. The infrared detector of claim 2, wherein, a lower electrode layer is located at the bottom of the at least one fin structure, and the lower electrode layer is in contact with the bottom of the sensitive layer; and an upper electrode layer is located above the at least one fin structure, and the upper electrode layer is in contact with the top of the sensitive layer.

5. The infrared detector of claim 4, wherein a part of one sidewall of the at least one fin structure in the second direction is not provided with the sensitive layer, and an output terminal of the upper electrode layer is connected with an edge of the upper electrode layer and is adjacent to the sidewall of the at least one fin structure which is not provided with the sensitive layer in the second direction extending to the surface of a semiconductor substrate; and the bottom of the output terminal of the upper electrode layer is not in contact with the lower electrode layer.

6. The infrared detector of claim 4, wherein the sensitive layer is further located on the top of the at least one fin structure.

7. The infrared detector of claim 2, wherein the sensitive layer is only located on the sidewall of the at least one fin structure, and the sensitive layer is surroundingly attached to the at least one fin structure, wherein the sensitive layer is provided with an opening so that terminals of the sensitive layer on two sides of the opening are formed.

8. The infrared detector of claim 7, wherein the sensitive layer is attached to the inner sidewall and the outer sidewall of the at least one fin structure and is not arranged on the sidewall of the fin in the second direction.

9. The infrared detector of claim 7, wherein a barrier layer formed by ion implantation is further arranged on the top of the at least one fin structure.

10. The infrared detector of claim 2, wherein the sidewalls of the plurality of fins of the fin structure surrounded by the sensitive layer are physically connected to each other and form a continuous film layer.

11. A manufacturing method of an infrared detector, comprising the following steps:
    Step 01, providing a semiconductor substrate;
    Step 02, preparing a lower electrode layer on the surface of the semiconductor substrate;
    Step 03, preparing at least one fin structure, as a non-doped structure, on the lower electrode layer;
    Step 04, forming a sensitive layer, as a doped layer, on a sidewall of the at least one fin structure;
    Step 05, forming an upper electrode layer above the at least one fin structure, wherein the upper electrode layer is in contact with the top of the sensitive layer, wherein the sensitive layer is configured to electrically connect the upper electrode layer and the lower electrode layer.

12. The manufacturing method of the infrared detector of claim 11, wherein in the step 03, the fin structure is prepared by an etching process, and the fin structure comprises a plurality of parallel fins in a first direction and a fin in a second direction, a plurality of terminals of the fins in the first direction are connected to the fin in the second direction; the first direction and the second direction are perpendicular to each other.

13. The manufacturing method of the infrared detector of claim 12, wherein the step 04 comprises:
    firstly, depositing the sensitive layer on the sidewall and the top of the fin;
    then, etching to remove a part of the sensitive layer of the outer sidewall of the fin in the second direction, and exposing the outer sidewall of the fin in the second direction.

14. The manufacturing method of the infrared detector of claim 13, wherein the step 05 comprises:
    firstly, depositing an upper electrode layer on the semiconductor substrate of the step 04;
    then, etching to remove the upper electrode layer on the sidewall of the sensitive layer and a part of the upper electrode layer on the surface of the semiconductor substrate; and
    reserving the upper electrode layer on the top of the sensitive layer and the top of the fin structure, and the upper electrode layer of the outer sidewall is exposed by the fin in the second direction, thereby forming an upper electrode layer pattern and forming a output terminal pattern of the upper electrode layer.

15. The manufacturing method of the infrared detector of claim 11, wherein in the step 04, during etching, the sensitive layer located on the top of the fin structure is also removed.

16. A manufacturing method of an infrared detector, comprising the following steps:
    Step 01, forming at least one fin structure as a non-doped structure;
    Step 02, forming a sensitive layer, as a doped layer, on all sidewalls of the at least one fin structure;
    Step 03, etching the sensitive layers on a part of the sidewalls of the at least one fin structure, and etching an opening in the sensitive layer so that the sensitive layer is provided with two terminals, the two terminals are not in contact, and the sidewalls of a part of the at least one fin structures are exposed through the opening;
    Step 04, forming a first electrode layer and a second electrode layer on the two terminals respectively so that the sensitive layer is configured to connect the first electrode layer with the second electrode layer, wherein the first electrode layer and the second electrode layer are not in contact.

17. The manufacturing method of the infrared detector of claim 16, wherein between the step 01 and the step 02, the method further comprises: performing an ion implantation on the top of the fin structure to form a barrier layer.

18. The manufacturing method of the infrared detector of claim 16, wherein the step 04 comprises: firstly, forming an electrode material layer on the top of the fin structure, the exposed sidewall of the fin structure, and the top and the sidewall of the sensitive layer; then, etching the electrode material layer to form the first electrode layer and the second electrode layer, the first electrode layer and the second electrode layer are not in contact.

19. The manufacturing method of the infrared detector of claim 16, wherein in step 03, the width of the formed opening is smaller than or equal to the distance between the first electrode layer and the second electrode layer.

\* \* \* \* \*